US008269199B2

(12) United States Patent
McGeoch (10) Patent No.: US 8,269,199 B2
(45) Date of Patent: Sep. 18, 2012

(54) LASER HEATED DISCHARGE PLASMA EUV SOURCE

(75) Inventor: Malcolm W. McGeoch, Little Compton, RI (US)

(73) Assignee: Plex LLC, Fall River, MA (US)

( * ) Notice: Subject to any disclaimer, the term of this patent is extended or adjusted under 35 U.S.C. 154(b) by 630 days.

(21) Appl. No.: 12/277,623

(22) Filed: Nov. 25, 2008

(65) Prior Publication Data

US 2009/0212241 A1 Aug. 27, 2009

Related U.S. Application Data

(60) Provisional application No. 61/004,656, filed on Nov. 29, 2007.

(51) Int. Cl.
*G21K 5/02* (2006.01)
(52) U.S. Cl. ............... 250/504 R; 250/493.1; 250/503.1
(58) Field of Classification Search ............... 250/493.1, 250/503.1, 504 R
See application file for complete search history.

(56) References Cited

U.S. PATENT DOCUMENTS

| 4,042,848 | A | 8/1977 | Lee | |
|---|---|---|---|---|
| 6,567,499 | B2 | 5/2003 | McGeoch | |
| 6,728,337 | B2 | 4/2004 | McGeoch | |
| 7,435,982 | B2 | 10/2008 | Smith | |
| 7,619,232 | B2 * | 11/2009 | Schmidt et al. | 250/504 R |
| 2005/0230645 | A1 | 10/2005 | Melnychuk et al. | |
| 2007/0085042 | A1 * | 4/2007 | Shumlak et al. | 250/504 R |
| 2007/0158594 | A1 * | 7/2007 | Shirai et al. | 250/504 R |
| 2007/0158595 | A1 | 7/2007 | McGeoch | |
| 2009/0224182 | A1 * | 9/2009 | McGeoch | 250/504 R |

FOREIGN PATENT DOCUMENTS

EP 1 887 841 2/2008

OTHER PUBLICATIONS

Banine et al,, "Plasma sources for EUV lithography exposure tools", J. Phys. D: Appl. Phys. 37 (2004) pp. 3207-3212.
Pankert et al., "Integrating Philips' extreme UV source in the alpha-tools", Proc. SPIE 5751 (2005) pp. 260-271.
Nishihara at al., "Further Improvement of CE up to 6-8% and B-field Mitigation of Fast Ions", Proc. Sematech 2007 International EUVL Symposium, Sapporo, Japan, pp. 1-21.
Hansson et al., "Liquid-jet laser-plasma extreme ultraviolet sources: from droplets to filaments", J. Phys. D: Appl. Phys. 37 (2004), pp. 3233-3243.
Partlo et al., "Development of an EUV (13.5nm) Light Source Employing a Dense Plasma Focus in Lithium Vapor", Proc. SPIE 3997 (2000) pp. 136-156.
Masnavi et al., "Potential of discharge-based lithium plasma as an extreme ultraviolet source", Appl. Phys. Lett, 89 031503 (2006) 3 pages.
McGeoch, M., "Lithium discharge EUV source", Proc. Sematech 2005 International EUVL Symposium, San Diego, CA, USA, 9 pages.

(Continued)

*Primary Examiner* — Michael Maskell
*Assistant Examiner* — Hanway Chang
(74) *Attorney, Agent, or Firm* — Wolf, Greenfield & Sacks, P.C.

(57) ABSTRACT

A self-magnetically confined lithium plasma which also may have an applied axial magnetic field is irradiated at sub-critical density by a carbon dioxide laser to generate extreme ultraviolet photons at the wavelength of 13.5 nm with high efficiency, high power and small source size.

12 Claims, 9 Drawing Sheets

OTHER PUBLICATIONS

McGeoch, M., "Lithium DPP Source Development at PLEX", Sematech EUV Source Workshop, Vancouver, Canada, May 2006, 21 pages.

Back et al., "Efficient multi-keV Underdense Laser-Produced Plasma Radiators", Phys. Rev. Lett. 87, No. 27, 275003 (2001), 4 pages.

Henke et al., "X-ray Interactions: Photoabsorption, Scattering, Transmission and Reflection at E=50-30,000eV, Z=1-92", At. Data and Nucl. Data Tables 54 (1993) pp. 181-343.

Masnavi et al., "Estimation of the Lyman-$\alpha$ line intensity in a lithium-based discharge-produced plasma source", J. Appl. Phys. 103, 013303 (2008), 8 pages.

Vlases, G.C., "Heating of Pinch Devices with Lasers", Physics of Fluids, 14 (1971), pp. 1287-1289.

Dawson, J.M., "Production of Plasmas by Long-Wavelength Lasers", AIAA Paper 70-779 (1970), pp. 1-6.

Johnston et al., "Correct values for high-frequency power absorption by inverse bremsstrahlung in plasmas", Phys. Fluids, 16 (1973), p. 722.

Lee et al., "Production of dense plasmas in a hypocycloidal pinch apparatus", Phys. Fluids, 20 (1977) pp. 313-321.

Wessel et al., "Generation of high magnetic fields using a gas-puff Z pinch", Appl. Phys. Lett. 48 (1986) pp. 1119-1121.

Liberman et al., "Physics of High Density Z-Pinch Plasmas", Section 6.6.1, Springer, NY (1999), pp. 218-224.

McGeoch et al., "Star Pinch Scalable EUV Source", Proc. SPIE 5037 (2003) pp. 141-146.

McGeoch, M.W., "PLEX Source Update", Sematech EUV Source Workshop, San Jose, Feb. 2005, 16 pages.

McGeoch, M.W., "Star Pinch EUV Source", Chapter 15, Extreme Ultraviolet Sources for Lithography, SPIE Press, Bellinghaven, WA (2005) 30 pages.

Masnavi et al., "Does lithium plasma in discharge-based extreme ultraviolet sources produce the necessary power for lithography?", Proc. Sematech 2007 EUVL Symposium, Sapporo, JP, pp. 1-8.

Nishihara et al., "Plasma physics and radiation hydrodynamics in developing an extreme ultraviolet light source for lithography", Physics of Plasmas 15, 056708 (2008) 11 pages.

Fiedorowicz et al., "X-ray emission from laser-irradiated gas puff targets", Appl. Phys. Lett. 62 (22), May 31, 1993, pp. 2778-2780.

International Search Report and the Written Opinion of the International Searching Authority mailed Mar. 19, 2009 from corresponding International Application No. PCT/US 08/13095.

* cited by examiner

LASER HEATED DISCHARGE PLASMA EUV SOURCE

CROSS REFERENCE TO RELATED APPLICATION

This application claims priority based on Provisional Application Ser. No. 61/004,656, filed Nov. 29, 2007, which is hereby incorporated by reference in its entirety.

BACKGROUND OF THE INVENTION

In order to have a high printing speed in extreme ultraviolet lithography, light at 13.5 nm with a minimum power of 1 kW in a narrow 2% fractional band is required out of the source into a solid angle of $2\pi$ steradians [1], with extremely low levels of contaminants and very high reliability. Two principal approaches to the production of this light have been followed to date, namely the discharge produced plasma (DPP) and the laser produced plasma (LPP). In the first of these a gaseous medium carries a pulsed high current discharge which pinches the plasma down to small dimensions with inertial and ohmic heating that induces radiation at 13.5 nm. In the second approach a pulsed laser is focused onto a solid target containing the chosen 13.5 nm radiator and the target is vaporized and ionized, with radiation being produced at 13.5 nm. After initial use of xenon as the radiator in both DPP and LPP configurations, the ultimate efficiency of xenon as a radiator within the required 2% fractional bandwidth at 13.5 nm was found to lie in the range of 0.5% to 1.0% by either approach. An additional disadvantage of the use of xenon was the stream of energetic ions released from the plasma, in either approach, which caused premature erosion of nearby components such as discharge walls, or collection optical elements.

Attention moved toward tin as a more efficient radiator than xenon, with up to 2% conversion efficiency in discharges [2] and potentially 6-8% efficiency in the LPP situation [3]. However, tin produced the same stream of high energy ions as xenon, causing erosion of nearby components such as electrodes and collector optical elements. Moreover, because tin (unlike xenon) had to be condensed on a trap in order not to coat optical elements with an absorbing layer, an added element in the system, referred to as a debris mitigation system (DMS) was necessary, and came with transmission efficiency that could be in the range of 50% or less. The relatively low volatility of tin implied the need for special techniques to provide tin vapor in a DPP source, and either a volatile compound of tin such as stannane was used, or tin vapor was produced by laser evaporation. In the latter case, the tin was brought to the point of use on a rotating disc [2]. As to the use of tin in LPP sources, the preferred approach has been to inject a stream of tin droplets or tin-containing droplets toward an interaction region where they are struck by a high power laser [4]. However, it has not been easy to generate the small tin droplets (less than 20 microns diameter) required in this process in order to have "mass-limited" plasmas that produce the least tin contamination. Above these difficulties is the production of high energy tin ions in either the DPP or LPP approach, ions which can only be slowed down by interaction with a gas blanket. Such gas blanket systems approach densities where the absorption of 13.5 nm light can significantly reduce the efficiency of the extreme ultraviolet (EUV) light source. Tin itself is a heavy atom that moves slowly, thereby building up a dense cloud around the plasma. Tin has an absorption cross section of $1.8 \times 10^{-17}$ cm$^2$ to EUV 13.5 nm light, implying a strict path-density product limit, and therefore limited capability to remove plasma heat. All of the tin-based DPP or LPP EUV sources discussed to date can only be scaled in output power via a linearly increasing feed of tin, with the consequence that it is increasingly difficult to 1) avoid absorption by the buffer gas and tin atoms and 2) remove plasma heat as power is scaled up.

Apart from tin, lithium has long been recognized as having attractive spectroscopy for an EUV source working material. Radiation from a lithium plasma can be mainly from a single transition, the 13.5 nm resonance transition of hydrogen-like Li$^{2+}$ [5]. Moreover, the intrinsic efficiency of radiation from a lithium discharge may rise to the 30% level into a $2\pi$ half space [6]. The energy of lithium ions from the plasma is ten times less than that of tin or xenon ions, so less gas can be used in the DMS, with less absorption. Numerous experiments have been performed on both DPP and LPP types of lithium-based EUV source. With few exceptions the DPP approaches have failed to contain lithium at the density required for an efficient EUV-producing pinch discharge. In only one of these works [7] has the lithium been stably contained with a wide-angle heat pipe that allows efficient exit of the EUV into a large solid-angle collector. In various lithium experiments of both the DPP and LPP type lithium has not been stably contained, and has spread throughout the apparatus causing deposition on collector optics and chemical interaction with many surface materials. It has been found virtually impossible to keep the cleanliness of an open, non heat pipe, vacuum system sufficiently high to avoid significant reactions of oxygen, nitrogen, water vapor etc. with the hot lithium, forming low volatility lithium compounds that also increase the viscosity of liquid lithium and degrade flow performance. However, the buffer gas heat pipe containment of lithium has been proven by the present applicant to keep the metal clean for extended periods of operation at high temperatures in the range of 850 C. Not only is lithium theoretically much more efficient than tin as a producer of EUV radiation, but its low EUV absorption cross section ($2 \times 10^{-18}$ cm$^2$) combined with its high particle velocity give lithium a factor of 20 advantage over tin in heat removal through the re-combined neutral atom cloud around a point plasma [8]. However, even with successful discharge operation in a confined lithium volume, it is not proven that the radiating source size will be sufficiently small to be fully usable within the approximately 3 mm$^2$sr etendue [1] of a stepper, and moreover, 13.5 nm production efficiency to date has been in the range of 1-2% in short pulse (sub –500 nsec) lithium discharges whereas much higher efficiency is predicted for longer duration discharges [6]. Longer duration discharges will not necessarily have the required small volume to match the stepper etendue.

SUMMARY OF THE INVENTION

The present invention aims to overcome the prior limitations of both DPP and LPP lithium EUV sources by using a hybrid method in which a magnetically confined lithium discharge plasma is laser-heated. This method is termed the "laser-heated discharge plasma" (LHDP). The radiating volume is then defined by the laser spot size and the laser absorption length in the lithium plasma, while lithium is confined and re-circulated so that power scaling does not involve an increase in ejected material that has to be trapped in a DMS. In fact, the total lithium inventory in this approach can be extremely small. Note that in distinction to prior art the plasma is not laser-produced, but merely laser-heated after being discharge-produced.

Direct laser irradiation of a solid density lithium target gives low conversion efficiency from laser light into EUV radiation because there is only a very thin layer of the laser-produced plasma that is at the correct density and temperature for efficient EUV emission. However, in the present invention a relatively long absorption length is obtainable if the plasma is arranged to be "underdense" to the incoming laser radiation. In this circumstance, the plasma electron density is less than the critical density for the laser wavelength λ defined by $n_c=1.1\times10^{21}/\lambda^2$ cm$^{-3}$, where λ is in μm. Below the critical density, the dominant laser absorption mechanism in the plasma is the process of inverse bremsstrahlung absorption. By varying the plasma density and temperature, as further discussed below, the absorption length may be tuned to the range of 1 mm or less, corresponding to the ideal EUV source dimension. Laser heating of a small confined gas volume that is under-dense to the laser radiation has previously been employed [9] to generate soft X-rays in the keV energy range, but the starting gas was neutral and confined by a thin membrane, whereas we propose to create a starting plasma via the self-magnetic constriction of a pinch discharge, which is particularly suited to EUV source design, especially in the case of lithium.

A principal problem of EUV source design stems from the extremely high absorption experienced by EUV light when passing through any solid material. The absorption coefficients for materials at the optimum EUV photon energy of 92 eV (13.5 nm) are tabulated in [10]. In consequence of this absorption, the EUV source plasma must be in direct view of the EUV light collecting mirror, with at most a low pressure (less than 1/100 of an atmosphere) of gas between the source and the mirror. Subsequent propagation of the EUV light has to be in near vacuum between the collecting mirror and the point of use.

The present embodiment of the LHDP method of EUV light generation depends upon the absorption of $CO_2$ laser light (wavelength 10.6 μm) in a plasma with electron density in the range $10^{17}$-$10^{19}$ cm$^{-3}$. If a shorter wavelength laser is used, such as the Nd laser at 1.06 μm, the electron density required for absorption is even higher at $10^{19}$-$10^{21}$ cm$^{-3}$. The achievement of such a high electron density is only possible at a high gas pressure which is incompatible with the collection of EUV light, unless an additional means of compression is employed wherein an initially low pressure gas is swept up into a much smaller volume just prior to the laser excitation pulse. A feature of the present invention is therefore the use of a plasma pinch to collect low density gas from a relatively large volume, and compress and ionize it in preparation for laser heating.

Of the various plasma pinch types, including the theta pinch and the Z-pinch, the former requires an enveloping conductor structure that is incompatible with efficient EUV light collection, whereas the Z-pinch is self-magnetically compressed. By this we mean that the current flowing axially in a Z-pinch itself generates an intense azimuthal magnetic field, which in turn compresses the plasma column. EUV light can therefore exit from a Z-pinch into a large collection solid angle without obstruction by an external field-generating conductor. In addition to the Z-pinch, the invention may be supported by a Star pinch, a hypocycloidal pinch or other self-magnetically compressed plasmas.

The EUV emission of a lithium Z-pinch has been calculated in detail by Masnavi et al [11]. From results presented by these authors it may be seen that for the density of $1\times10^{18}$ electrons cm$^{-3}$ that is preferred for the present invention, in which laser absorption is via. inverse bremsstrahlung, the 13.5 nm lithium line emits relatively weakly at a plasma temperature of 10 eV, but many times more intensely at a plasma temperature of 15 eV. Our approach is therefore to locally heat the Z-pinch plasma column by laser absorption, starting from a background temperature of 10 eV already established in the pinch. The heated region alone radiates EUV light strongly.

Laser heating of pinch plasmas was proposed in 1970 [12, 13] as a method of raising plasma temperature to initiate thermonuclear fusion reactions. The absorption mechanism proposed was inverse bremsstrahlung and the plasmas were theta pinch and Z-pinch types. This earlier work did not lead to the design of any extreme ultraviolet light source. Axial laser pumping was proposed because plasma containment in a linear device depended upon few encounters with the lossy end regions, and therefore very long devices, up to 1,000 m in length, were proposed. As discussed above, the EUV source requires a plasma diameter less than 1 mm and a pumped length of the order of 1 mm, achieved via. radial, or transverse, incidence of a focussed laser beam, as distinct from axial pumping.

The LHDP source is intrinsically a pulsed source because the confinement of a pinch is transitory, mainly because of instabilities in the plasma geometry. As long as the pinch has to be established at high repetition rate between two electrodes, one can take advantage of this to reverse the direction of the pinch current on each successive pulse. This has the effects of a) heating the two electrodes equally as the discharge cathode provides the main source of heat and this is now shared equally, and b) balancing lithium inventory between the electrodes via cancellation of ionic drift. In regard to the drive circuit for this oscillating discharge, when a capacitor is connected across the pinch electrodes energy not dissipated in the plasma on one "stroke" of the device is re-deposited as stored energy of the opposite polarity in the capacitor, ready for use in the following, oppositely directed, pulse. A power supply has to "top up" the capacitor between pulses. Energy recovery also obtains if the capacitor is not directly coupled to the electrodes, but instead is coupled via a "step down" transformer, which aids in matching a higher impedance power supply to the typically very low impedance of a pinch discharge.

According to a first aspect of the invention, there is provided an extreme ultraviolet light source in which a magnetically self-confined plasma is produced via a pulsed discharge and the plasma energy in a small region of the plasma is increased by absorption of laser light resulting in locally increased excitation of ionic species that radiate extreme ultraviolet light.

According to a second aspect of the invention, an extreme ultraviolet light source at 13.5 nanometers is based on the emission of lithium ions in which a magnetically self-confined lithium plasma of electron density less than $10^{19}$ cm$^{-3}$ is produced via a pulsed discharge and the plasma energy in a small region of the plasma is increased by absorption of laser light at the wavelength of 10.6 microns, resulting in locally increased excitation of hydrogen-like lithium to its resonance level and increased radiation at 13.5 nanometers.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
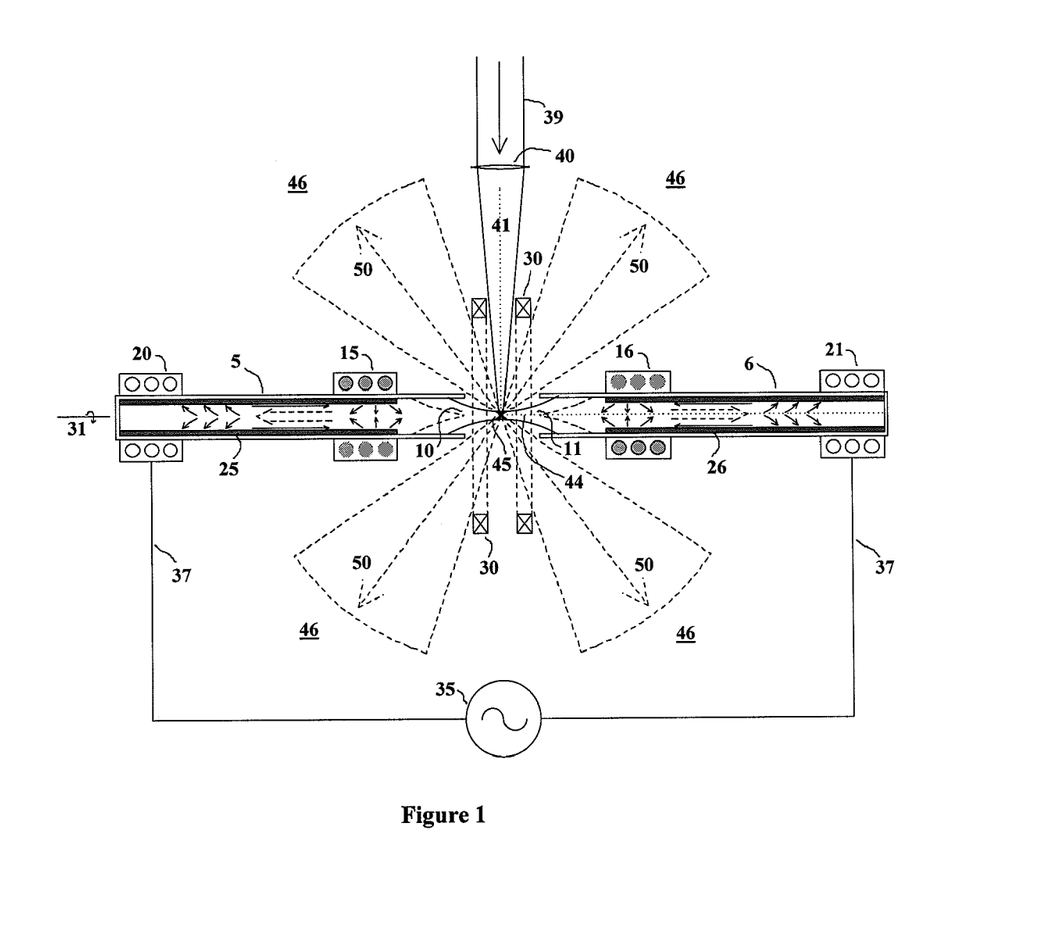
FIG. 1 is a schematic diagram of a linear coaxial pinch discharge in lithium, heated by a carbon dioxide laser.

A first embodiment of the invention is illustrated in FIG. 1, relating to linear coaxial Z-pinch confinement of the lithium plasma with heating by a transversely incident pulsed or continuous wave carbon dioxide laser. An axial magnetic field may also be applied to enhance pinch confinement stability.

Figure 4:
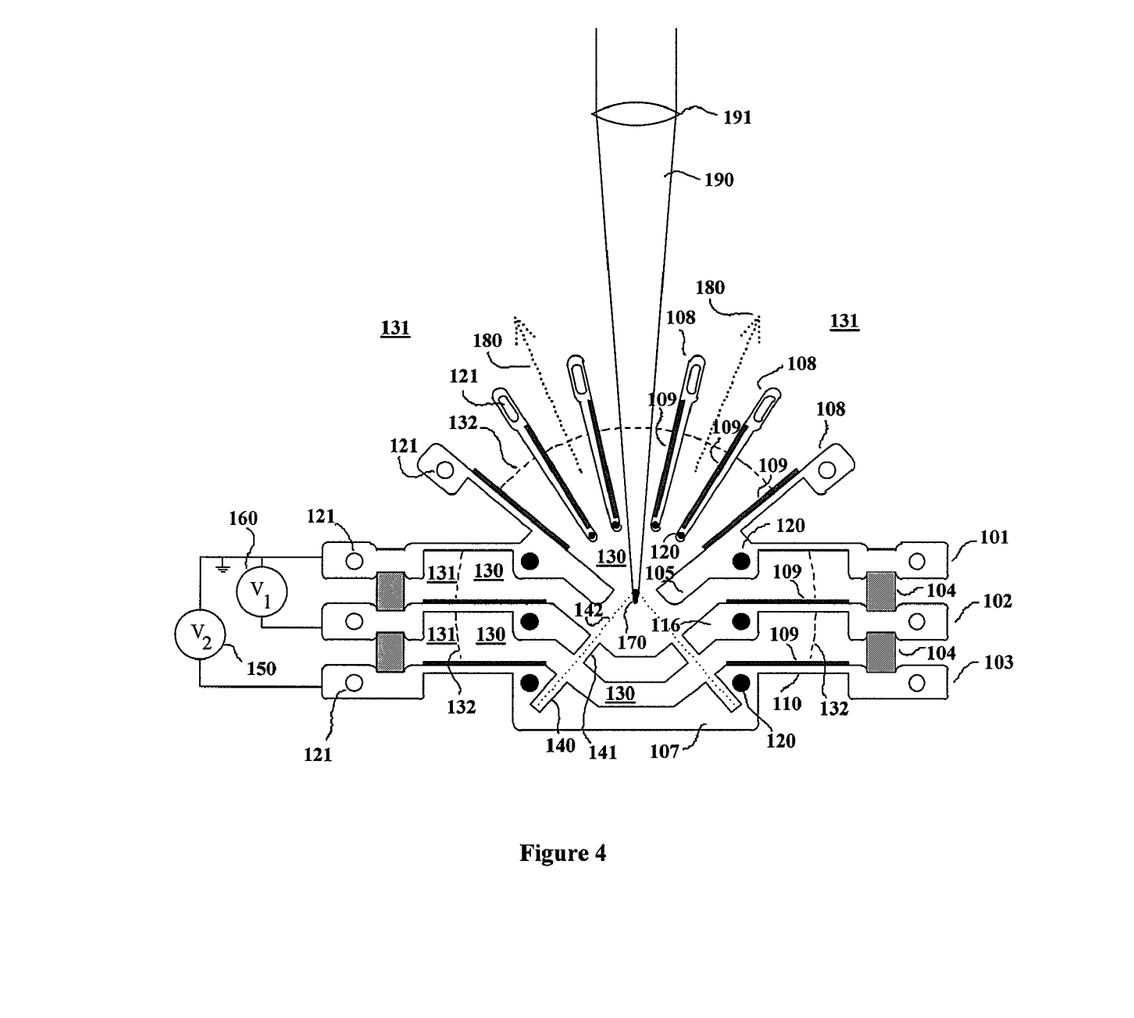
FIG. 4 is a schematic diagram of an LHDP extreme ultraviolet source using lithium star pinch discharge geometry.

A second embodiment of the invention is illustrated in FIG. 4, relating to star pinch confinement of the lithium plasma with heating by a pulsed carbon dioxide laser.

Figure 7:
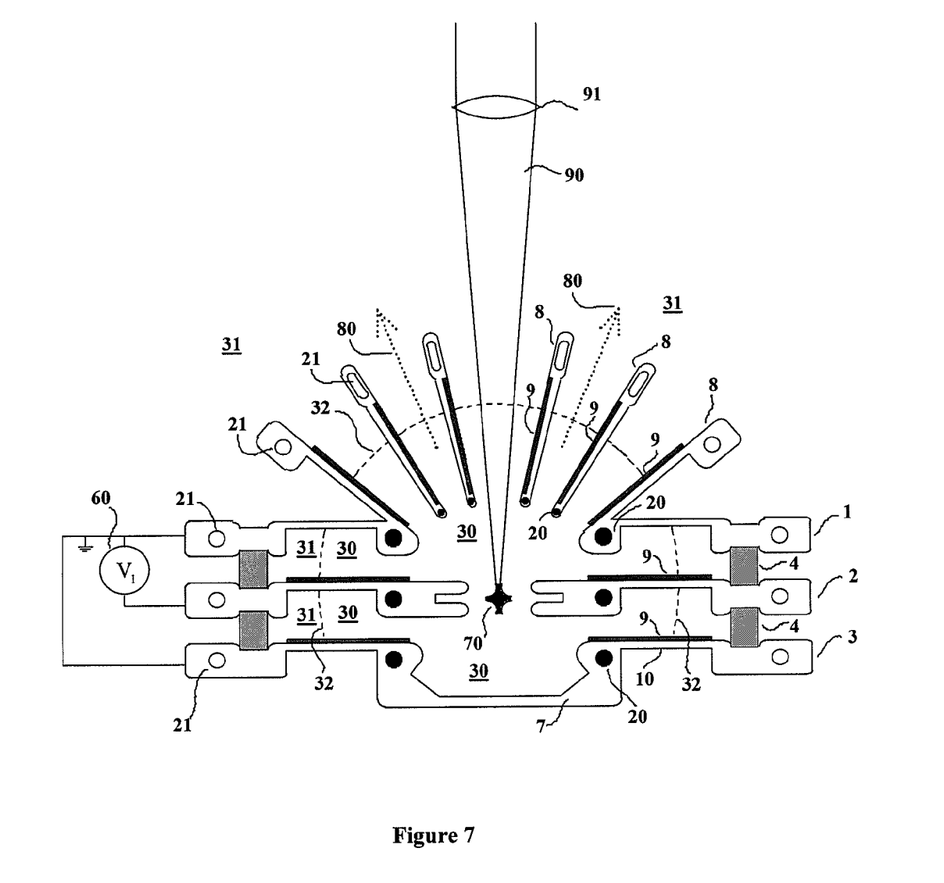
FIG. 7 is a schematic diagram of an LHDP extreme ultraviolet source using lithium hypocycloidal pinch discharge geometry.

A third embodiment of the invention is illustrated in FIG. 7, relating to hypocycloidal pinch confinement of the lithium plasma with heating by a pulsed carbon dioxide laser.

Figure 8:
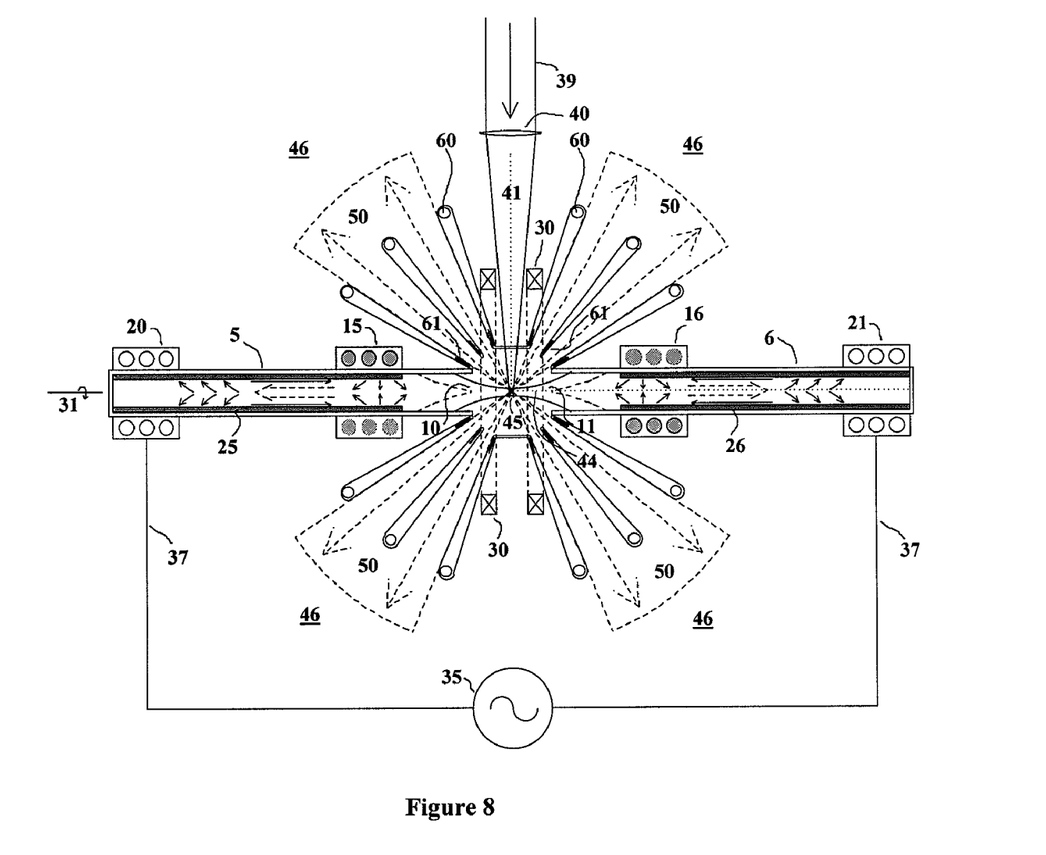
FIG. 8 is a schematic diagram of an LHDP linear pinch extreme ultraviolet source with a horizontal axis of rotational symmetry, not including the laser beam, and six conical heat pipe structures enclosing four conical heat pipe volumes for lithium reflux.

A fourth embodiment of the invention relates to additional lithium vapor containment applied to the geometry of the first embodiment, as illustrated in FIG. 8.

Figure 9:
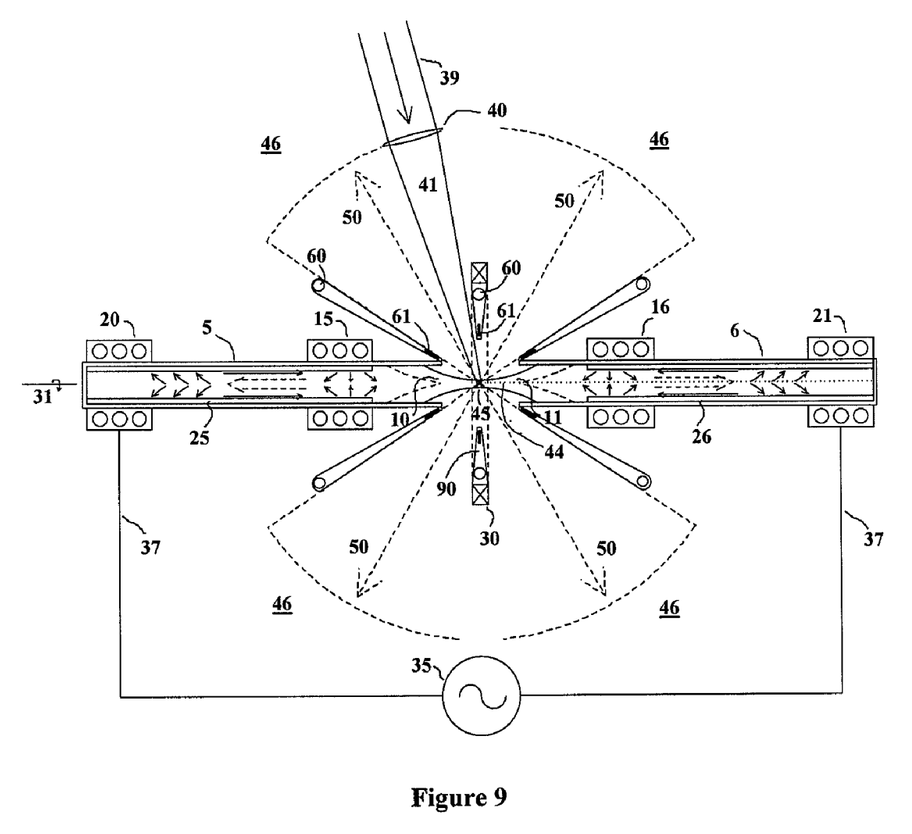
FIG. 9 is a schematic diagram of an LHDP linear pinch extreme ultraviolet source with a horizontal axis of rotational symmetry, not including the laser beam, and lithium reflux via a central ignitor disc and conical surfaces in contact with the open ends of each heat pipe electrode.

A fifth embodiment of the invention relates to an additional ignition electrode added to the fourth embodiment, as illustrated in FIG. 9.

Before describing the operation of each of these embodiments in detail, some general description will be given of the absorption mechanism. The carbon dioxide laser has its principal wavelength at 10.6 microns, and is reflected from a plasma of electron density greater than $10^{19}$ electrons $cm^{-3}$. Just below this density the carbon dioxide laser radiation is strongly absorbed by a process known as inverse bremsstrahlung absorption. The absorption length is given by [14, 15]:

$$L_{ab} = \frac{5 \times 10^{27} T_e^{3/2}}{n_e^2 Z \lambda^2} \left(1 - \frac{\lambda^2}{\lambda_e^2}\right)^{1/2}$$

where $\lambda$ is the wavelength in cm, $\lambda_e$ is the wavelength of radiation at the plasma electron frequency $\omega_e$; i.e. $\lambda_e = 2\pi c/\omega_e$ and $\omega_e^2 = 4\pi n_e e^2/m_e$, $T_e$ is the electron temperature in eV, $n_e$ is the electron density in $cm^{-3}$, and Z is the ionic charge.

The laser intensity decreases with depth x into the plasma as:

$$I = I_0 \exp(-x/L_{ab})$$

Figure 2:
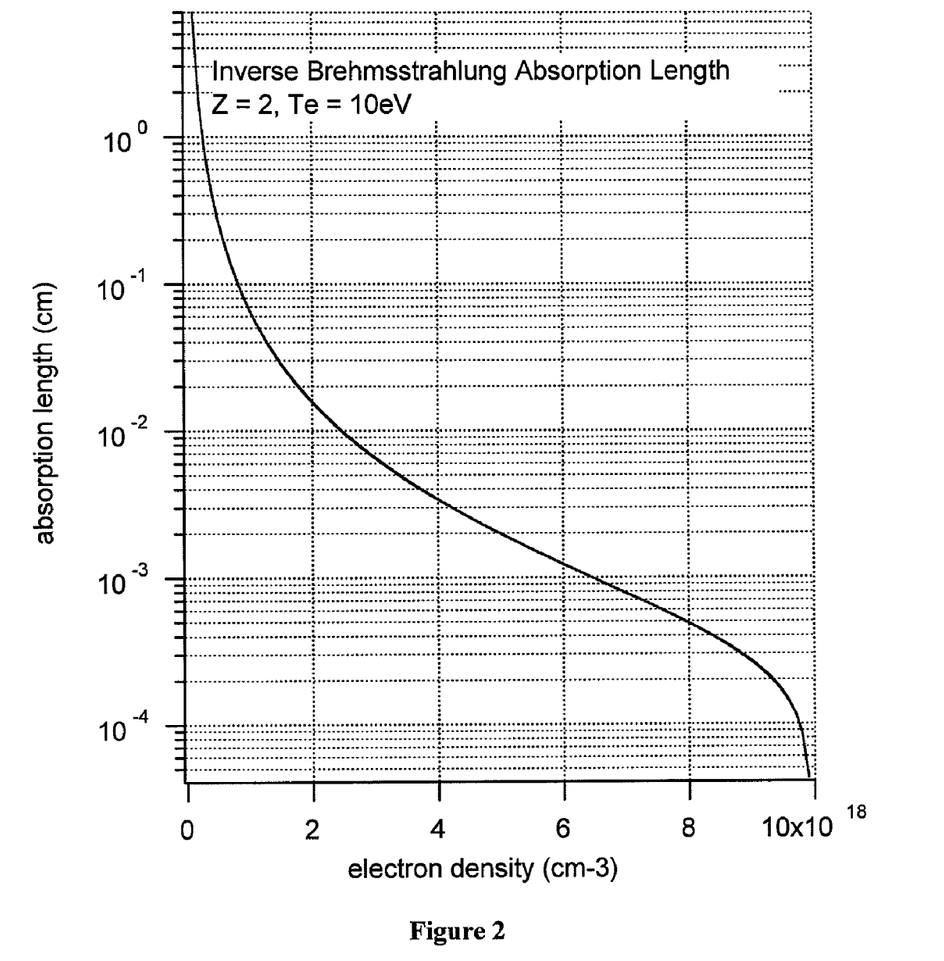
FIG. 2 is a graph of calculated carbon dioxide laser inverse brehmsstrahlung absorption length in a lithium plasma as a function of electron density.

FIG. 2 shows the calculated absorption length for a typical plasma temperature of 10 eV, and average charge of Z=2, corresponding to conditions for which a significant $Li^{2+}$ ion density is present. In that figure it is seen that a 1 mm absorption depth requires an electron density of approximately $1 \times 10^{18}$ $cm^{-3}$, corresponding to a lithium ion density of $5 \times 10^{17}$ $cm^{-3}$.

The absorbed laser energy is given initially to the plasma electrons, which thermalise into an increasingly hot Maxwellian energy distribution, until excitation increases from the ground to first excited state of the $Li^{2+}$ ion. Re-radiation to the ground state occurs within 26 psec, with the emission of a 13.5 nm photon. The lithium ion is then available for a further cycle of excitation and radiation. The 13.5 nm extreme ultraviolet light is most intense from the absorption volume, defined by the focal spot diameter of the heating laser, and the absorption depth. This volume may therefore be tuned in shape and size to optimize illumination uniformity in lithography or another use. Provided the absorbed laser power dominates heat transport out of the absorption region by plasma thermal conduction, there will be efficient conversion of absorbed light at 10.6 μm into EUV radiation at 13.5 nm occurring within a volume of approximately the same size as the absorption volume. The linear geometry of a Z-pinch, with its strong azimuthal self-field, acts as a natural heat trap, because the conduction of heat is only significant along the axis of the pinch. It may be shown that an axial heat flow of one to several kW can exist close to the laser absorption region, so the laser power should be greater than a few kW for optimum small plasma size, to avoid "smearing" by thermal diffusion. In more exact terms, considering deposition of heat within a plasma length L, the characteristic time τ for heat loss by diffusion through the ends of this length is [13]:

$$\tau = \frac{(Z+1)n_e L^2}{10^{20} T_e^{5/2}}$$

where $T_e$ is the electron temperature in eV, $n_e$ is the electron density in $cm^{-3}$, Z is the ionic charge and L is in cm. As an example, for length L=0.1 cm, Z=2, $n_e = 1 \times 10^{18}$ $cm^{-3}$ and $T_e = 12$ eV (heated from a background pinch temperature of 10 eV), the characteristic heat loss time is 600 nsec. If the laser heating pulse is of less than 600 nsec in duration, the heated region will not expand beyond 1 mm in length, and the source size criterion is satisfied.

In a published patent application [16] Horioka et al. have considered a lithium Z-pinch discharge that may have additional current control in order to maintain the plasma density and temperature at optimum values for efficient EUV generation. Also, an applied axial magnetic field is provided in order to stabilize the pinch. Stabilization of a Z-pinch via an applied axial field has long been demonstrated experimentally [17] and predicted theoretically [18]. Horioka et al. [16] also propose an external heating device, either a laser or electron beam, to both heat the electrodes and the plasma. As discussed above, use of a laser to heat a plasma is well documented in the literature [12, 13]. The present invention describes localized laser heating of a small region within the whole length of the pinch, with the purpose of greatly increasing EUV radiation from just that region in order to satisfy the stringent etendue requirements of the lithography application. As used herein, a "small region" refers to a region that will fit inside a sphere of diameter 1.5 mm, but the small region is not necessarily spherical in shape. Another way in which the present invention differs from Horioka et al. is in the use of a wide angle heat pipe structure [19] to capture and re-circulate lithium vapor.

The first embodiment of the invention, shown in FIG. 1, operates as follows. Coaxial cylindrical heat pipes 5 and 6 are aligned on axis of symmetry 31. They are opposed to each other, with open ends 10 and 11 facing each other. The heat pipe interior walls have meshes 25, 26 installed along most of their length in order to contain molten lithium and allow it to flow from the cooler outer end of a heat pipe to the hotter central region. A charge of solid lithium is initially laid inside each of tubes 5 and 6. Heater structures 15 and 16 are disposed on the outside of each tube near the inner end of the mesh. Cooling structures 20 and 21, with water flow, are disposed around each outer end of tubes 5 and 6. A magnet coil 30, coaxially aligned with axis of symmetry 31 is energized by a current to produce a magnetic field in the central region. Mid-way between openings 10 and 11 the magnetic field is at its highest intensity, and is aligned with axis 31. Alternating current and voltage generator 35 is connected by conductors 37 to the outer ends of each of tubes 5 and 6. Carbon dioxide laser beam 39 is focused by lens 40 to converge in focused beam 41 on an interaction region 45 within the space between openings 10 and 11. The space 46 around the components is kept under vacuum, or filled to a low pressure with an unreactive buffer gas such as helium.

In operation, heaters 15 and 16 are employed to raise the temperature of the inner ends of heat pipes 5 and 6 to the approximate range of 800-900 C, while cooling elements 20 and 21 continue to be at less than about 200 C. The vapor pressure of lithium, expressed as number density, is shown as a function of temperature in FIG. 3 in which region 200 indicates the region of most interest here. Lithium within tubes 5 and 6 melts, flows toward the center of the apparatus, and begins to evaporate from the hot regions adjacent to heaters 15 and 16. As the lithium density rises through a value of about $10^{15}$ atoms $cm^{-3}$, an alternating voltage applied by generator 35 strikes a discharge between hollow electrodes 10 and 11. The almost complete ionization of lithium in the space between entrances 10 and 11 causes lithium to be trapped by the applied magnetic field, with very slight probability of escape. Continued heating to an inner temperature in the range of 800 C to 900 C raises the lithium density to the $10^{16}$-$10^{17}$ $cm^{-3}$ range. At this time, if sufficient alternating current is driven by generator 35, the discharge between hollow electrodes 10 and 11 constricts, (44), increasing the lithium ion density to the $5\times10^{17}$ $cm^{-3}$ range at which laser absorption is efficient in a length of about 0.1 cm. A pulsed decrease in diameter from 5 mm to 1 mm yields a 25 times density increase, raising the lithium density from a quiescent value of $2\times10^{16}$ $cm^{-3}$ to $5\times10^{17}$ $cm^{-3}$. The lithium atoms are mostly doubly ionized when the plasma electron temperature is heated to about 10 eV in this density regime. Focused carbon dioxide laser beam 41 deposits its energy within a small plasma volume 45 at the waist of discharge 44, and 13.5 nm extreme ultraviolet radiation leaves volume 45 in beams 50 that encompass a large fraction of the available $4\pi$ solid angle. The carbon dioxide laser can be timed to pulse its energy at the point of maximum discharge constriction on each half cycle of generator 35. The symmetry of this configuration ensures that the lithium load in each of heat pipe tubes 5 and 6 remains approximately equal. When the average absorbed carbon dioxide laser power becomes significant in comparison to the power in heaters 15 and 16, the latter power is reduced by a control circuit that may operate by measurement of the internal resistance of the heater elements within 15 and 16. Excess heat is then removed from the central region by heat pipe action.

Although illustrated with the carbon dioxide-lithium system of interest for 13.5 nm production, the principle described above in reference to FIG. 1 can be applied with other metal vapors and the same or other laser wavelengths, to generate other extreme ultraviolet wavelengths of interest in various applications.

The second embodiment of the invention, shown in FIG. 4 operates as follows. The pulsed discharge plasma of a lithium star pinch [7, 20, 21] is used as the target for a focused carbon dioxide laser that heats the plasma and causes enhanced radiation at 13.5 nm. The configuration of FIG. 4 is that of a wide angle heat pipe EUV source as disclosed in [19].

Before describing the star pinch discharge action that generates 13.5 nm radiation, the basis for metal vapor control within the source will be described. With reference to the embodiment illustrated in FIG. 4, disc-shaped electrodes 101, 102, 103 are separated by insulators 104. A central, vertical symmetry axis describes these electrodes. Electrode 101 is the discharge anode, electrode 102 is an "inner shell" electrode, and electrode 103 is the discharge cathode. The central part 107 of cathode 103 carries an array of holes 140 that are aligned so that their axes 142 all intersect at a position 170 on the central symmetry axis. In one realization there are 12 holes in this array. The central part 116 of inner shell 102 carries a corresponding array of holes 141 aligned on axes 142 of the cathode holes. In addition to the three electrode discs, the structure comprises a nested array of surfaces 108 that together define the collection solid angle subtended by the plasma source at location 170. These surfaces are aligned with the direction of 13.5 nm radiation rays 180, so as to provide the least possible obscuration of rays 180. Although these surfaces may be conical, other constructions of the surfaces such as a tapered honeycomb or grid are understood to be possible.

Each passage between the disc-shaped electrodes 101 and 102, or 102 and 103, or between the surface elements 108 carries on at least one of its sidewalls a wick 109 that may comprise a woven mesh, porous material or set of radially aligned grooves. Symmetry about a central vertical axis implies that, for example, the wicks 109 shown on the inner shell 102 or cathode 103 have the shape of flat annular discs. The central regions of the apparatus carry heater elements 120. The outer regions of the apparatus carry coolant channels 121.

In operation, when the apparatus is assembled, sheets of the metal to be used in vapor form to produce 13.5 nm radiation are attached parallel to the wicks 109. The apparatus is filled with a low pressure of the chosen buffer gas, which is preferably helium for the lithium source, and at room temperature helium fills not only the apparatus, regions 130 and 131, but is also present 131 in the 13.5 nm propagation space. A typical pressure of helium for use with lithium is in the range of 1-4 torr.

Figure 5:
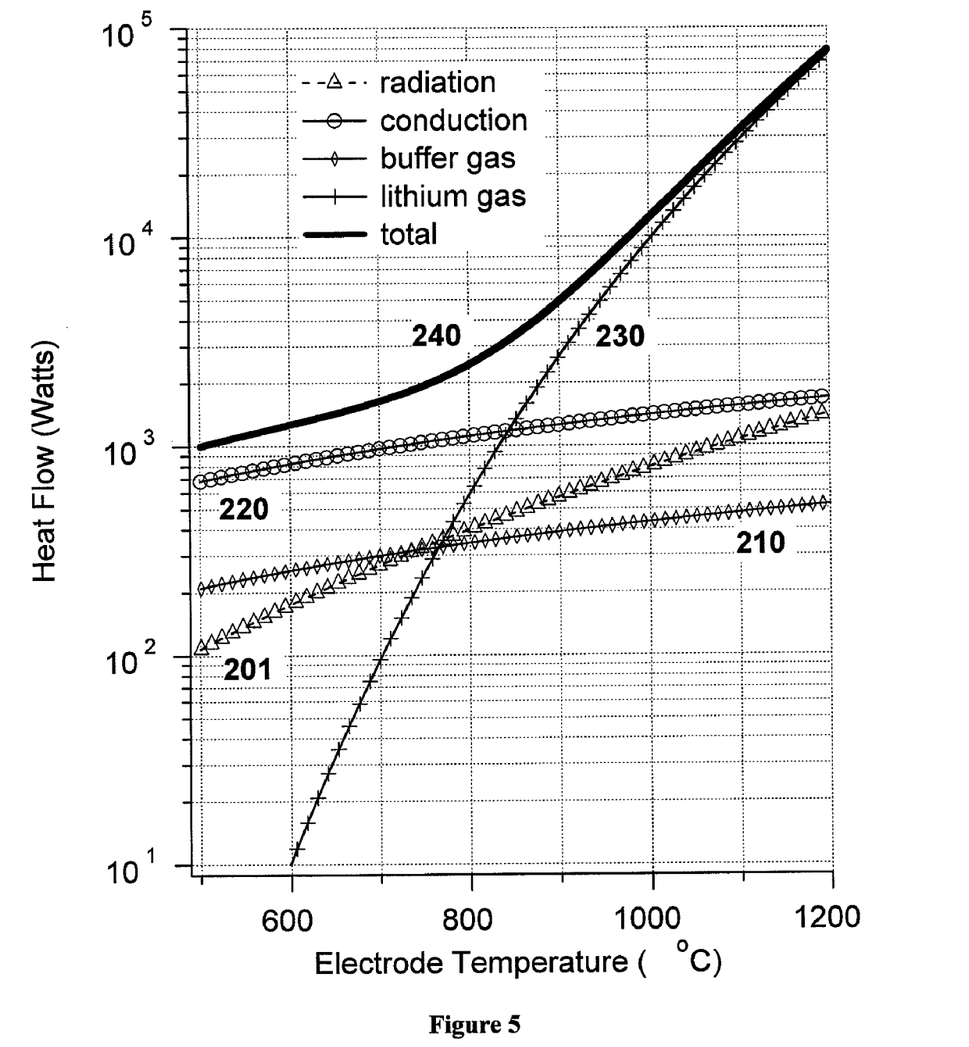
FIG. 5 is a graph of estimated heat losses due to conduction, convection and radiation in the star pinch.

Heat is provided by heater elements 120 in order to raise the central temperature. The temperature of the wicks also rises because thermal breaks 110, or the thin walls of structures 108, allow the wick temperature to rise well above the coolant temperature. The loaded metal then melts and infiltrates into the wicks 109. Further heating raises the metal temperature in the parts of the wicks closest to central location 170, until the vapor pressure of the metal approaches the buffer gas pressure. The heat input necessary to achieve this is shown in FIG. 5 for a realization of this source employing lithium with helium as the buffer gas that has been explored experimentally by the applicant. In that figure the different contributions to heat loss from the center to the outside of the apparatus are first shown as separate curves, and then summed to form a total. Radiation (curve 201) is a relatively small loss, as is conduction through the helium buffer (210).

A larger heat flow (curve 220) is caused by conduction through the lithium-soaked wicks, and supporting thermal breaks 110. By far the largest heat flow (curve 230) at elevated temperature is due to the convection of enthalpy by lithium vapor that is evaporated in the central region, flows toward the outer regions, and condenses on the cooler outer parts of the wicks, giving up its heat. In order to reach a central temperature of 800 C, appropriate for 13.5 nm production in a star pinch of lithium vapor, a combined heat input (curve 240) of 2-3 kW is required in this realization. Lithium that has condensed on the outer parts of the wicks flows as liquid back toward the central region, to be available for re-evaporation, setting up a steady-state vapor density distribution.

Figure 3:
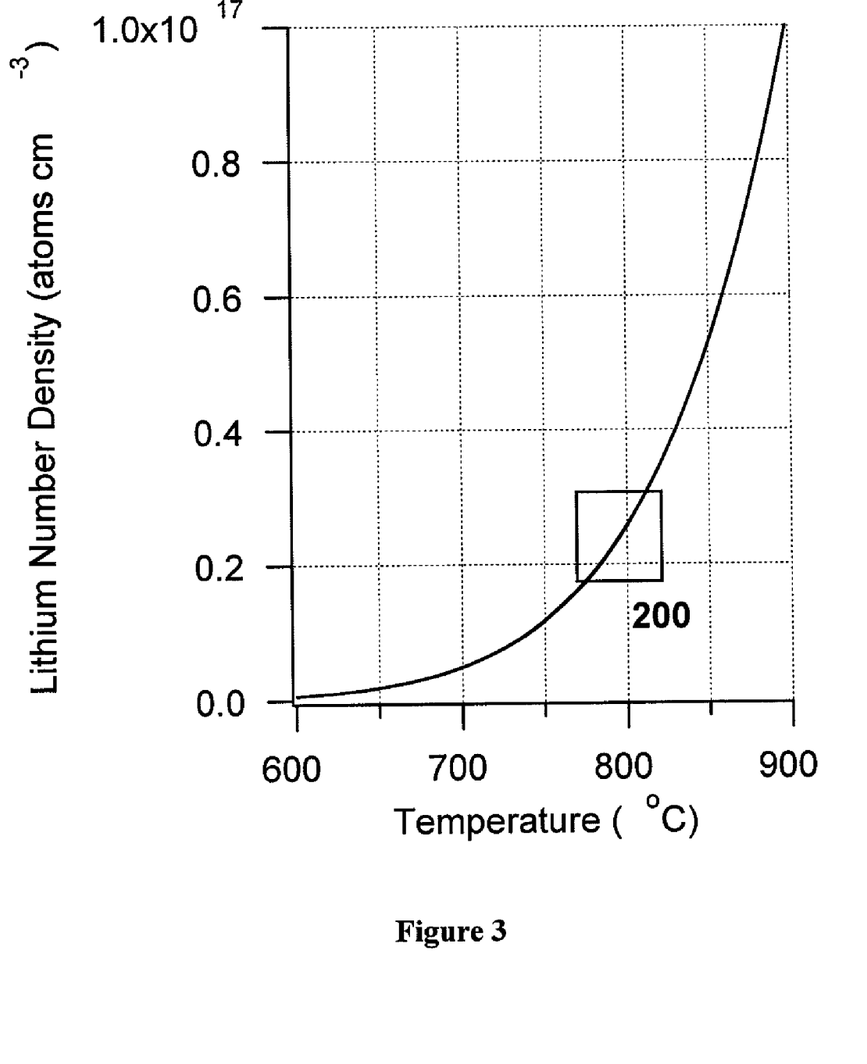
FIG. 3 is a graph of lithium number density in equilibrium over liquid lithium as a function of temperature.
Figure 6:
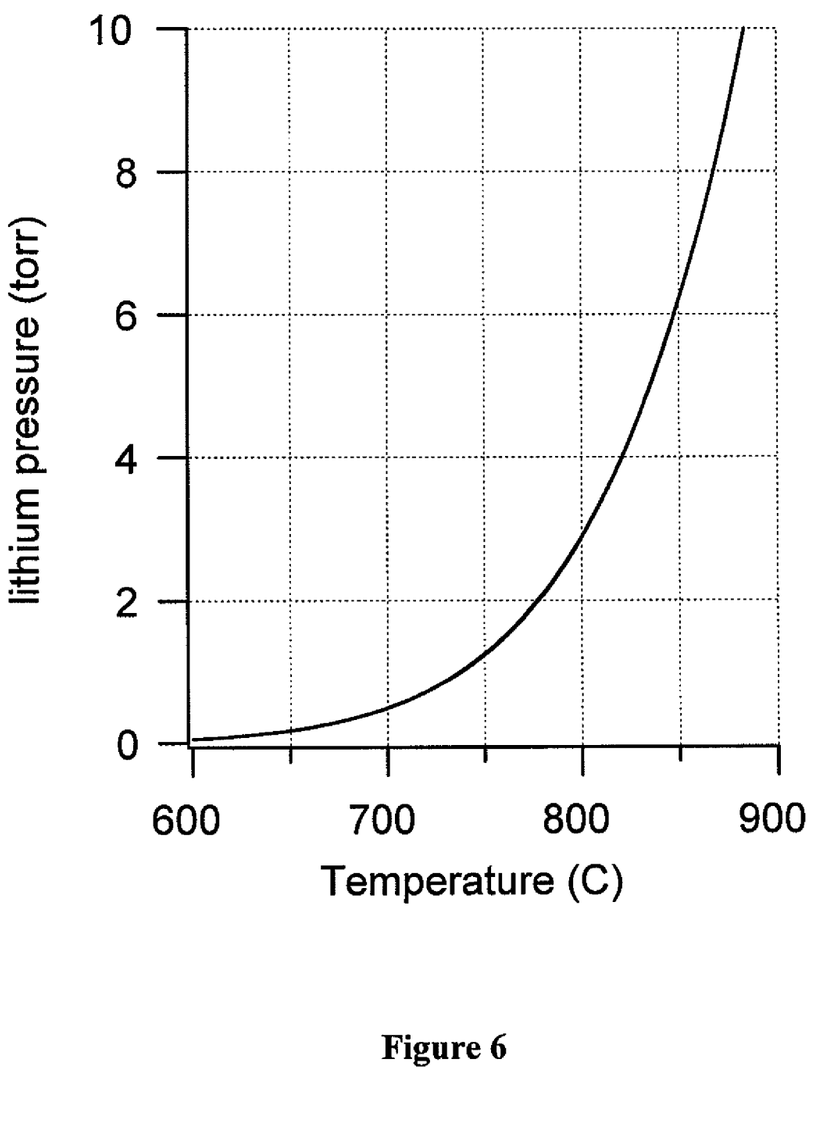
FIG. 6 is a graph of required buffer gas pressure to contain lithium in the star pinch as a function of temperature.

FIG. 3 shows the target range for lithium vapor density 200 in which the density of lithium metal vapor equals that of xenon gas measured for optimum 13.5 nm emission from xenon in the same discharge geometry. This ensures that the drive circuit can deposit a large fraction of its energy into plasma movement. It is seen that this target density range corresponds to a temperature of approximately 800 C. The corresponding vapor pressure of lithium, that is matched by the pressure of the buffer gas, is shown in FIG. 6. A buffer gas pressure in the approximate range of 1-4 torr is utilized. As this temperature is approached, lithium displaces essentially all of the helium buffer in central region 130, and a relatively sharp interface 132 develops between the lithium in central region 130 and helium in outer region 131.

In a multiple-electrode lithium vapor discharge device (with two or more electrodes) there is a risk that one of the electrodes becomes cooler than the others and in consequence becomes more loaded with liquid lithium via condensation. When this happens, the thermal conductivity of this liquid lithium tends to pull the electrode temperature further down, establishing an unstable downward temperature spiral, to the detriment of the available lithium vapor pressure. Such an occurrence is prevented by use of a separate temperature control circuit for each electrode. One method, disclosed in [19] of sensing an electrode's temperature is to measure the electrical resistance of the heater element within the electrode, as long as this element is in good thermal contact with the body of the electrode. The resistance of refractory metal heater elements is quite a strong function of temperature. A temperature control circuit can be based on the establishment of a preset resistance within the heater element corresponding to a known temperature of the metallic resistance material. This temperature control mechanism is also necessary once significant additional power is being fed into the electrical discharges to be described below. As discharge power increases, the controller decreases power fed to the electrode in an attempt to stabilize its temperature at the preset value.

Once a refluxing equilibrium vapor density of the working metal vapor, in this case lithium, has been established, electrical pulses are applied to the electrodes to generate a hot plasma at position 170 that efficiently radiates 13.5 nm light. To facilitate this, voltage generator $V_1$ (160) is connected between anode 101 and inner shell 102. Also, voltage generator $V_2$ (150) is connected between anode 101 and cathode 103. The arrangement of electrodes and pulse generators in FIG. 4 is one realization of the star pinch, an extreme ultraviolet source type described in prior disclosures [20, 21] and publications [22, 23, 24] in which several implementations of the star pinch principle have been described. Although several electrical modes of operation are possible, in a preferred embodiment a direct current "keep alive" current is applied via voltage generator 160 between inner shell 102 and anode 101. Voltage generator 160 maintains inner shell 102 at a negative potential of typically between 100 and 1,000 volts relative to anode 101 while supplying a discharge current of between 10 and 1,000 mA. During this resting "keep alive" phase, voltage generator 150 is not activated, but presents effectively a low impedance between anode 101 and cathode 103, keeping them at the same potential. The "keep alive" discharge generates ions in the channels defined by axes 142 between cathode holes 140 and inner shell holes 141. These ions are accelerated toward the inner shell by its negative potential relative to the cathode. On passage through channels 141 and along axes 142, a proportion of these ions are neutralized by resonant charge exchange, and proceed as neutral lithium atoms toward region 170. In a second phase of operation, inner shell 102 is pulsed negative for approximately 1 microsecond via an increased current from voltage generator 160, raised to a level of 1 to 100 Amps, when additional atoms are projected toward region 170. In the final phase of discharge production, after an additional delay of up to several microseconds the main power pulse is applied via voltage generator 150 to the cathode 103 and anode 101. A current pulse of typically between 500 A and 10 kA and duration typically between 100 nsec and 10 µsec is applied via a negative pulse from voltage generator 150 to cathode 103, the current flowing between cathode 103 and anode 101, via passages 141. During this high current pulse the low density plasma that has been pre-formed at location 170 is heated and compressed to reach an electron temperature typically in the range 5 eV to 20 eV, and an electron density typically in the range $10^{17}$ to $10^{18}$ electrons cm$^{-3}$. Once the plasma is formed, carbon dioxide laser beam 190 is focussed via lens 191 into the plasma and heats the plasma to perform excitation of the hydrogen-like lithium resonance line. The heating mechanism is inverse bremsstrahlung absorption. A plot of the absorption length is given in FIG. 2 as a function of the electron density. The critical density for 10.6 micron carbon dioxide laser radiation is $1\times10^{19}$ electrons cm$^{-3}$. Just below this density (at sub-critical density) the absorption length varies as shown in FIG. 2, and can be arrange to be of the order of 0.1 cm by choice of the electron density in the region of $1\times10^{18}$ cm$^{-3}$. Under these conditions there is copious production of the Li$^{2+}$ ion and excitation into its excited states that lead to intense radiation on its resonance transition at 13.5 nm. The 13.5 nm light is radiated in all directions, but the backward propagating light through structures 108 can be collected and used for lithography or other purposes.

The third embodiment of the invention, shown in FIG. 7, operates as follows. In this EUV source the handling of lithium vapor is accomplished in the same manner as for the second embodiment. The difference lies in the type of magnetically confined lithium discharge. FIG. 7 shows a hypocycloidal pinch [15] in which electrodes 1 and 3 are symmetrically disposed around electrode 2, and the whole apparatus has a vertical axis of rotational symmetry. This type of pinch has opposed "Z-pinch" regions that contain a small central region 70 around a point of null magnetic field where a hot plasma builds up. In operation, once a working density of lithium vapor 30 has been established, contained in a buffer gas heat pipe by helium buffer 31, a voltage pulse applied to electrode 2 establishes discharges between the inner edges of electrodes 1 and 2, and electrodes 2 and 3. For example, if central electrode 2 is negatively pulsed, it acts as the cathode for pinch discharges on each side of it, with anodes 1 and 3 respectively. Application of several kAmps of current in a pulse of the order of one microsecond collapses and heats the hypocycloidal pinch plasma, to the point where its electron density is approximately $1\times10^{18}$ electrons cm$^{-3}$ and its temperature is 10 eV. This plasma type has been observed [15] to have much greater stability than Z-pinch discharges alone, and its use has been suggested [25] for lithium EUV source work, but not with localized laser heating, as in the present disclosure. Once the correct underdense plasma conditions have been established, $CO_2$ laser beam 90, focused by lens 91, is pulsed into a mm-sized region of the hypocycloidal pinch to further heat the plasma and generate intense 13.5 nm radiation from the small laser absorption region which can be many times smaller than the plasma of the hypocycloidal pinch.

A fourth embodiment of the invention is shown in FIG. 8. This is identical in operation to the first embodiment except for the addition of six conical heat pipe structures with heating elements 61 and cooling elements 60 respectively, at the inner and outer edges of the (truncated) cones. A helium buffer gas is also added, with the same heat pipe containment function as previously described with reference to the second embodiment. The surfaces of the cones can have meshes to return lithium after condensation, thereby acting as a DMS, and allowing operation with a small lithium inventory.

A fifth embodiment of the invention is shown in FIG. 9. This is similar in operation to the first embodiment except for the addition of conical surfaces on each of the two main discharge electrodes and the addition of a single central disc electrode 90 embedded within which is a magnetic field coil 30. The heating laser beam 41 is now inclined at 15 degrees to the radial direction so as to clear the disc electrode structure 90. Each of the conical surfaces can have heating elements 61 and cooling elements 60 respectively, at the inner and outer edges of the (truncated) cones. The central disc electrode can have heating element 61 and cooling element 60 at its inner and outer edge, respectively. As provided in the wide angle heat pipe patent [19], each disc or conical surface can have a mesh for lithium reflux. In operation, the central disc electrode 90 can be attached to a high impedance supply and biassed positive or negative relative to the main discharge electrodes by a potential in the range 100V to 5 kV in order to create a low density of seed electrons for the main pinch discharge.

REFERENCES

1. V. Banine and R. Moors, "Plasma sources for EUV lithography exposure tools" J. Phys. D, Appl. Phys. 37, 3207-3212 (2004).
2. J. Pankert et al., "Integrating the Philips extreme UV source in alpha tools", Proc. SPIE 5751, 260-271 (2005).
3. K. Nishihara et al., "Further improvement of CE up to 5-6% and B field mitigation of fast ions", Proc. Sematech 2007 International EUVL Symposium, Sapporo, Japan.
4. B. A. M. Hansson and H. M. Hertz, "Liquid-jet laser-plasma extreme ultraviolet sources: from droplets to filaments", J. Phys. D: Appl. Phys. 37, 3233-3243 (2004).
5. W. Partlo, I. Fomenkov, R. Oliver and D. Birx, "Development of an EUV (13.5 nm) light source employing a dense plasma focus in lithium vapor", Proc. SPIE 3997, 136-156 (2000).
6. M. Masnavi, M. Nakajima, A. Sasaki, E. Hotta and K. Horioka, "Potential of discharge-based lithium plasma as an extreme ultraviolet source", Appl. Phys. Lett. 89, 031503 (2006).
7. M. McGeoch, "Lithium discharge EUV source", Proc. Sematech 2005 International EUVL Symposium, San Diego, USA.
8. M. McGeoch, Sematech EUV Source Workshop, Vancouver, May 2006.
9. C. A. Back et al., "Efficient multi-keV underdense laser-produced plasma radiators", Phys. Rev. Lett. 87, 275003 (2001).
10. B. L. Henke, E. M. Gullikson and J. C. Davis, "X-ray Interactions: Photoabsorption, Scattering, Transmission and Reflection at E=50-30,000 eV, Z=1-92", At. Data and Nucl. Data Tables 54, 181-343 (1993).
11. M. Masnavi, M. Nakajima, E. Hotta and K. Horioka, "Estimation of the Lyman-α line intensity in a lithium-based discharge-produced plasma source", J. Appl. Phys. 103, 013303 (2008).
12. G. C. Vlases, "Heating of Pinch Devices with Lasers", Physics of Fluids 14, 1287-1289 (1971).
13. J. M. Dawson, "Production of Plasmas by Long Wavelength Lasers", AIAA Paper 70-779 (1970).
14. T. W. Johnston and J. M. Dawson "Correct values for high-frequency power absorption by inverse bremsstrahlung in plasmas", Phys. Fluids 16, 722 (1973).
15. J. H. Lee, D. R. McFarland and F. Hohl, "Production of dense plasmas in a hypocycloidal pinch apparatus", Phys. Fluids 20, 313-321 (1977)
16. K. Horioka, M. Masnavi and E. Hotta, "Plasma Generating Apparatus and Plasma Generating Method" Intl. Patent Pub. WO2006/120942 (16.11.2006 Gazette 2006/46).
17. F. J. Wessel, F. S. Felber, N. C. Wild, H. U. Rahman, A. Fisher and E. Ruden, "Generation of high magnetic field using a gas-puff Z-pinch", Appl. Phys. Lett. 48, 1119-1121 (1986).
18. M. A. Liberman, J. S. DeGroot, A. Toor and R. B. Spielman, "*Physics of High Density Z-Pinch Plasmas*", Section 6.6.1, Springer, New York (1999).
19. M. W. McGeoch "Extreme ultraviolet source with wide-angle vapor containment and reflux", US Patent application published July 2007 (#20070158595), all claims allowed.
20. M. W. McGeoch "Star pinch X-ray and extreme ultraviolet photon source", U.S. Pat. No. 6,567,499 (2003).
21. M. W. McGeoch "Star pinch plasma source of photons or neutrons", U.S. Pat. No. 6,728,337 (2004).
22. M. W. McGeoch and C. T. Pike, "Star pinch scalable EUV source", Proc. SPIE 5037, pp 141-146 (2003).
23. M. W. McGeoch, Sematech EUV Source Workshop, San Jose, February (2005).
24. M. W. McGeoch, "Star pinch EUV source", Chapter 15, *Extreme Ultraviolet Sources for Lithography*, SPIE Press, Bellinghaven, Wash., (2005).
25. M. Masnavi et al. Proc. Sematech 2007 EUVL symposium, Sapporo, Japan.

Further realizations of this invention will be apparent to those skilled in the art. Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. An extreme ultraviolet light source in which a magnetically self-confined plasma is produced via a pulsed discharge and subsequently the plasma energy in a small region of the plasma is increased by absorption of laser light resulting in locally increased excitation of ionic species that radiate extreme ultraviolet light, wherein a direction of current flow is reversed on successive pulses.

2. A source as in claim 1, in which an axial static magnetic field is applied to guide a coaxial discharge between opposed open-ended heat pipes and the laser impinges radially onto the discharge plasma.

3. A source as in claim 2, in which ignition of the discharge is assisted by a potential applied to a disc electrode located symmetrically between the main discharge electrodes, with a central hole through which the discharge passes.

4. A source as in claim 3, in which lithium is confined within a buffer gas heat pipe formed by the electrodes and the central disc with wide angle vapor containment and reflux.

5. A source as in claim 1, in which each phase of the discharge comprises a quiescent low current period followed by a high current period of shorter duration that pinches the plasma and increases its density and temperature in preparation for laser heating.

6. A source as in claim 5, in which the low current ranges from 1 Amp to 100 Amp and the high current ranges from 100 Amp to 10 kAmp.

7. A source as in claim 5, in which the quiescent period has a duration between 5 μsec and 50 μsec and the high current period has a duration between 500 nsec and 5 μsec.

8. An extreme ultraviolet light source at 13.5 nm based on the emission of lithium ions in which a magnetically self-confined lithium plasma of electron density less than $10^{19}$ cm$^{-3}$ is produced via a pulsed discharge and subsequently the plasma energy in a small region of the plasma is increased by absorption of laser light at the carbon dioxide laser wavelength, resulting in locally increased excitation of hydrogen-like lithium to its resonance level and increased radiation at 13.5 nm, wherein a direction of current flow is reversed on successive pulses.

9. A source as in claim 8, in which an axial static magnetic field is applied to guide a coaxial discharge between opposed open-ended lithium heat pipes and the carbon dioxide laser impinges radially onto the discharge plasma.

10. A source as in claim 8, in which the lithium is confined within a buffer gas heat pipe with wide angle vapor containment and reflux.

11. A source as in claim 8, in which a Z-pinch discharge provides the magnetically self-confined lithium volume for the purpose of increasing the lithium ion density and creating a plasma density greater than $10^{17}$ electrons per cm$^3$ at an electron temperature exceeding five electron volts.

12. A source as in claim 8, in which a hypocycloidal pinch discharge geometry is applied to the production of a lithium plasma density greater than $10^{17}$ electrons per cm$^3$ at an electron temperature exceeding five electron volts.

* * * * *